(12) United States Patent
Jiang et al.

(10) Patent No.: US 12,464,755 B2
(45) Date of Patent: Nov. 4, 2025

(54) INTEGRATED CIRCUIT, TRANSISTOR AND METHOD OF FABRICATING THE SAME

(71) Applicant: Taiwan Semiconductor Manufacturing Company, Ltd., Hsinchu (TW)

(72) Inventors: Yu-Wei Jiang, Hsinchu (TW); Sheng-Chih Lai, Hsinchu County (TW); Feng-Cheng Yang, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 209 days.

(21) Appl. No.: 18/336,044

(22) Filed: Jun. 16, 2023

(65) Prior Publication Data

US 2023/0327006 A1    Oct. 12, 2023

Related U.S. Application Data

(62) Division of application No. 17/400,138, filed on Aug. 12, 2021, now Pat. No. 11,721,747.

(51) Int. Cl.
| | |
|---|---|
| *H01L 29/66* | (2006.01) |
| *H01L 23/528* | (2006.01) |
| *H01L 51/30* | (2006.01) |
| *H10B 51/30* | (2023.01) |
| *H10D 30/01* | (2025.01) |
| *H10D 30/69* | (2025.01) |

(52) U.S. Cl.
CPC ..... *H10D 30/0415* (2025.01); *H01L 23/5283* (2013.01); *H10B 51/30* (2023.02); *H10D 30/701* (2025.01)

(58) Field of Classification Search
CPC ............. H10D 30/0415; H10D 30/701; H10D 64/033; H10D 64/689; H01L 23/5283; H10B 51/30
USPC ........................................... 438/3
See application file for complete search history.

(56) References Cited

U.S. PATENT DOCUMENTS

| | | | | |
|---|---|---|---|---|
| 6,057,584 | A * | 5/2000 | Gardner ............... | H10D 64/685 257/295 |
| 6,831,313 | B2 * | 12/2004 | Uchiyama ............ | H10D 30/701 257/295 |
| 7,550,349 | B2 * | 6/2009 | Yoon .................. | H01L 21/28238 438/257 |
| 8,119,475 | B2 * | 2/2012 | Lee ....................... | H10D 64/035 438/142 |
| 9,064,865 | B2 * | 6/2015 | Chi ....................... | H10D 64/691 |
| 10,056,463 | B2 * | 8/2018 | Xing .................. | H10D 30/6755 |

(Continued)

*Primary Examiner* — Sheikh Maruf
(74) *Attorney, Agent, or Firm* — JCIPRNET

(57) ABSTRACT

A transistor includes a gate electrode, a ferroelectric layer, a channel layer, a gas impermeable layer, a dielectric layer, a source line and a bit line. The ferroelectric layer is disposed on the gate electrode. The channel layer is disposed on the ferroelectric layer. The gas impermeable layer is disposed in between the channel layer and the gate electrode, and in contact with the ferroelectric layer. The dielectric layer is surrounding the ferroelectric layer and the channel layer, and in contact with the gas impermeable layer. The source line and the bit line are embedded in the dielectric layer and connected to the channel layer.

20 Claims, 12 Drawing Sheets

(56) References Cited

U.S. PATENT DOCUMENTS

| | | | | |
|---|---|---|---|---|
| 11,646,374 | B2* | 5/2023 | Penumatcha | H10D 64/251 |
| | | | | 257/295 |
| 11,818,896 | B2* | 11/2023 | Huang | H10D 30/6755 |
| 12,069,868 | B2* | 8/2024 | Young | H10D 30/63 |
| 2002/0168785 | A1* | 11/2002 | Paz de Araujo | H01L 21/31691 |
| | | | | 257/E21.208 |
| 2002/0190296 | A1* | 12/2002 | Shimada | H10B 53/30 |
| | | | | 257/295 |
| 2005/0068822 | A1* | 3/2005 | Kijima | H10D 30/701 |
| | | | | 257/E21.208 |
| 2007/0063238 | A1* | 3/2007 | Kaibara | H10B 53/00 |
| | | | | 257/295 |
| 2008/0242074 | A1* | 10/2008 | Lee | H10B 69/00 |
| | | | | 257/E21.179 |
| 2012/0161122 | A1* | 6/2012 | Yamazaki | H10D 30/6755 |
| | | | | 257/43 |
| 2015/0348909 | A1* | 12/2015 | Yamazaki | H10D 86/60 |
| | | | | 438/638 |
| 2017/0337884 | A1* | 11/2017 | Kurokawa | G09G 3/3629 |
| 2018/0012937 | A1* | 1/2018 | Park | H10N 70/8825 |
| 2018/0096648 | A1* | 4/2018 | Kurokawa | G06F 1/3218 |
| 2018/0102086 | A1* | 4/2018 | Katayama | H10D 30/6755 |
| 2022/0344513 | A1* | 10/2022 | Huang | H10D 30/611 |

* cited by examiner

INTEGRATED CIRCUIT, TRANSISTOR AND METHOD OF FABRICATING THE SAME

CROSS-REFERENCE TO RELATED APPLICATION

This application is a divisional application of and claims the priority benefit of U.S. application Ser. No. 17/400,138, filed on Aug. 12, 2021, now allowed. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
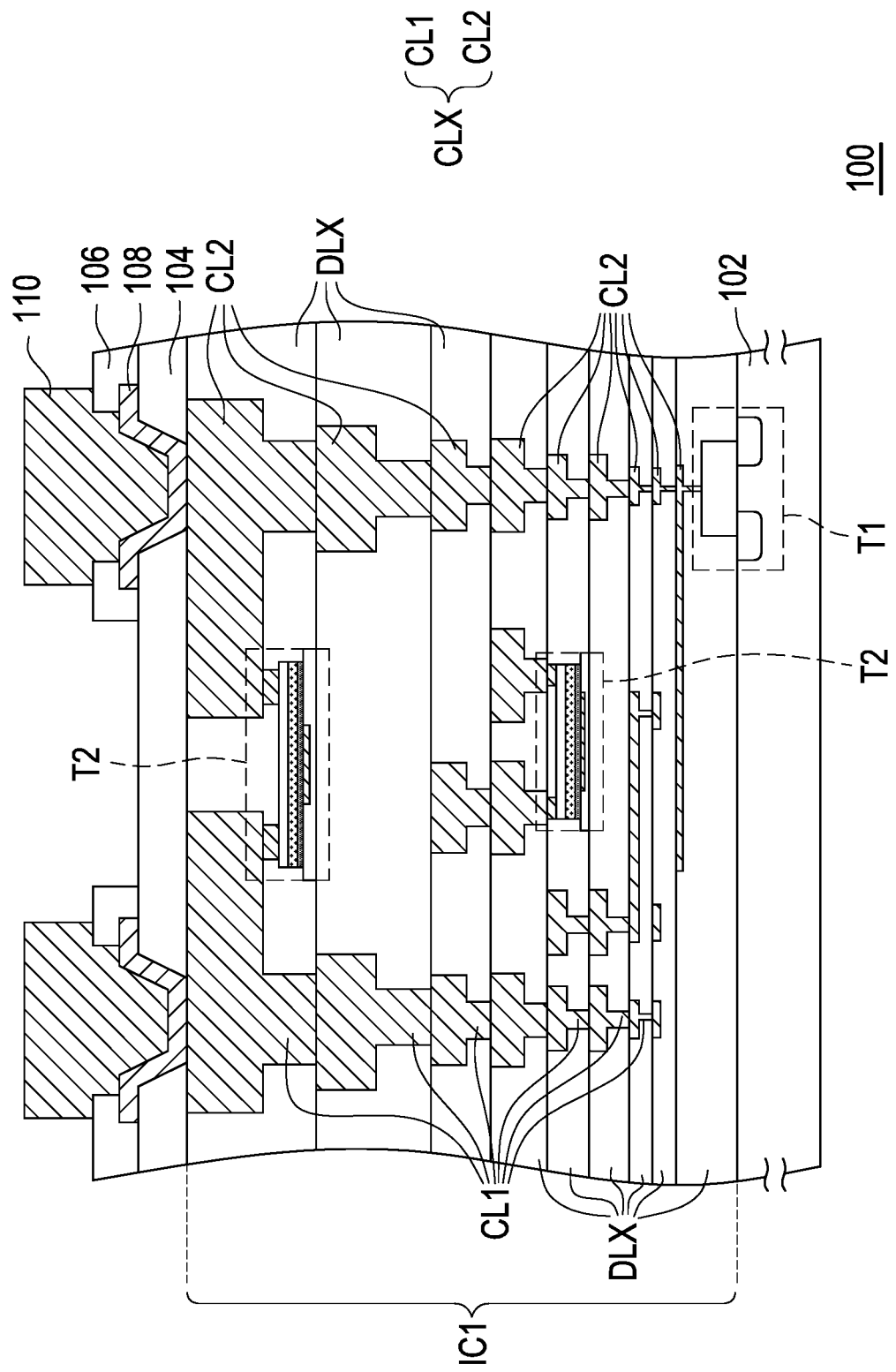
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of an integrated circuit 100 in accordance with some embodiments of the disclosure. In some embodiments, the integrated circuit 100 includes a substrate 102, an interconnection layer IC1, a passivation layer 104, a post-passivation layer 106, a plurality of conductive pads 108, and a plurality of conductive terminals 110. In some embodiments, the substrate 102 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 102 may be a bulk silicon substrate, a silicon-on-insulator (SOI) substrate, or a germanium-on-insulator (GOI) substrate.

In some embodiments, the substrate 102 includes various doped regions depending on circuit requirements (e.g., p-type semiconductor substrate or n-type semiconductor substrate). In some embodiments, the doped regions are doped with p-type or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a transistor T1, which is formed over the substrate 102. Depending on the types of the dopants in the doped regions, the transistor T1 may be referred to as n-type transistor or p-type transistor. In some embodiments, the transistor T1 further includes a metal gate and a channel under the metal gate. The channel is located between the source region and the drain region to serve as a path for electron to travel when the transistor T1 is turned on. On the other hand, the metal gate is located above the substrate 102 and is embedded in the interconnection layer IC1. In some embodiments, the transistor T1 is formed using suitable Front-end-of-line (FEOL) process. For simplicity, one transistor T1 is shown in FIG. 1. However, it should be understood that more than one transistor T1 may be presented depending on the application of the integrated circuit 100. When multiple transistors T1 are presented, these transistors T1 may be separated by shallow trench isolation (STI; not shown) located between two adjacent transistors T1.

As shown in FIG. 1, the interconnection layer IC1 is disposed on the substrate 102. In some embodiments, the interconnection layer IC1 includes a plurality of conductive layers CLX and a plurality of dielectric layers DLX alternately stacked up along a build-up direction. The interconnection layer IC1 further includes a plurality of transistors T2 located in between the plurality of dielectric layers DLX.

As illustrated in FIG. 1, the conductive layers CLX includes conductive vias CL1 and conductive patterns CL2 embedded in the dielectric layers DLX. In some embodiments, the conductive patterns CL2 located at different level heights are connected to one another through the conductive vias CL1. In other words, the conductive patterns CL2 are electrically connected to one another through the conductive vias CL1. In some embodiments, the bottommost conductive vias CL1 are connected to the transistor T1. For example, the bottommost conductive vias CL1 are connected to the metal gate, which is embedded in the bottommost dielectric layer DLX, of the transistor T1. In other words, the bottommost conductive vias CL1 establish electrical connection between the transistor T1 and the conductive patterns CL2 of the interconnection layer IC1. As illustrated in FIG. 1, the bottommost conductive via CL1 is connected to the metal gate of the transistor T1. It should be noted that in some alternative cross-sectional views, other bottommost conductive vias CL1 are also connected to source/drain regions of the transistor T1. That is, in some embodiments, the bottommost conductive vias CL1 may be referred to as "contact structures" of the transistor T1.

In some embodiments, the dielectric layers DLX include materials such as polyimide, epoxy resin, acrylic resin, phenol resin, benzocyclobutene (BCB), polybenzooxazole (PBO), or any other suitable polymer-based dielectric material. Alternatively, the dielectric layers DLX may be formed of oxides or nitrides, such as silicon oxide, silicon nitride, or the like. The dielectric layers DLX may be formed by suitable fabrication techniques such as spin-on coating, chemical vapor deposition (CVD), plasma-enhanced chemical vapor deposition (PECVD), or the like.

In some embodiments, the conductive layers CLX include materials such as aluminum, titanium, copper, nickel, tungsten, or alloys thereof. The conductive layers CLX (including conductive patterns CL2 and the conductive vias CL1) may be formed by electroplating, deposition, and/or photolithography and etching. In some embodiments, the conductive patterns CL2 and the underlying conductive vias CL1 are formed simultaneously. It should be noted that the number of the dielectric layers DLX, the number of the conductive layers CLX illustrated in FIG. 1 are merely for illustrative purposes, and the disclosure is not limited thereto. In some alternative embodiments, fewer or more layers of the dielectric layers DLX and the conductive layers CLX may be formed depending on the circuit design.

In some embodiments, the transistors T2 are embedded in the interconnection structure IC1. For example, each transistor T2 is embedded in one of the dielectric layers DLX. In some embodiments, the transistors T2 are electrically connected to the conductive patterns CL2 through the corresponding conductive vias CL1. In some embodiments, the transistors T2 may be arranged in an array (e.g. array of transistors/array of memory cells) in each of the dielectric layers DLX. The formation method and the structure of the transistors T2 will be described in detail later.

As illustrated in FIG. 1, the passivation layer 104, the conductive pads 108, the post-passivation layer 106, and the conductive terminals 110 are sequentially formed on the interconnection layer IC1. In some embodiments, the passivation layer 104 is disposed on the topmost dielectric layer DLX and the topmost conductive layer CLX (conductive pattern CL2). In some embodiments, the passivation layer 104 has a plurality of openings partially exposing the topmost conductive patterns CL2. In some embodiments, the passivation layer 104 is a silicon oxide layer, a silicon nitride layer, a silicon oxy-nitride layer, or a dielectric layer formed by other suitable dielectric materials. The passivation layer 104 may be formed by suitable fabrication techniques such as (high-density plasma chemical vapor deposition) HDP-CVD, PECVD, or the like.

In some embodiments, the conductive pads 108 are formed over the passivation layer 104. In some embodiments, the conductive pads 108 extend into the openings of the passivation layer 104 to be in direct contact with the topmost conductive patterns CL2. That is, the conductive pads 108 are electrically connected to the interconnection layer IC1. In some embodiments, the conductive pads 108 include aluminum pads, copper pads, titanium pads, nickel pads, tungsten pads, or other suitable metal pads. The conductive pads 108 may be formed by, for example, electroplating, deposition, and/or photolithography and etching. It should be noted that the number and the shape of the conductive pads 108 illustrated in FIG. 1 are merely for illustrative purposes, and the disclosure is not limited thereto. In some alternative embodiments, the number and the shape of the conductive pads 108 may be adjusted based on demand.

In some embodiments, the post-passivation layer 106 is formed over the passivation layer 104 and the conductive pads 108. In some embodiments, the post-passivation layer 106 is formed on the conductive pads 108 to protect the conductive pads 108. In some embodiments, the post-passivation layer 106 has a plurality of contact openings partially exposing each conductive pad 108. The post-passivation layer 106 may be a polyimide layer, a PBO layer, or a dielectric layer formed by other suitable polymers. In some embodiments, the post-passivation layer 106 is formed by suitable fabrication techniques such as HDP-CVD, PECVD, or the like.

As illustrated in FIG. 1, the conductive terminals 110 are formed over the post-passivation layer 106 and the conductive pads 108. In some embodiments, the conductive terminals 110 extend into the contact openings of the post-passivation layer 106 to be in direct contact with the corresponding conductive pad 108. That is, the conductive terminals 110 are electrically connected to the interconnection layer IC1 through the conductive pads 108. In some embodiments, the conductive terminals 110 are conductive pillars, conductive posts, conductive balls, conductive bumps, or the like. In some embodiments, a material of the conductive terminals 110 includes a variety of metals, metal alloys, or metals and mixture of other materials. For example, the conductive terminals 110 may be made of aluminum, titanium, copper, nickel, tungsten, tin, and/or alloys thereof. The conductive terminals 110 are formed by, for example, deposition, electroplating, screen printing, or other suitable methods. In some embodiments, the conductive terminals 110 are used to establish electrical connection with other components (not shown) subsequently formed or provided. Up to here, an integrated circuit 100 in accordance with some embodiments of the present disclosure is accomplished.

As illustrated in FIG. 1, a plurality of transistors T2 are embedded in the interconnection layer IC1 in between the dielectric layers DLX. The formation method and the structure of the transistor T2 will be described in more detail by referring to FIG. 2A to FIG. 2J shown below.

Figure 2A:
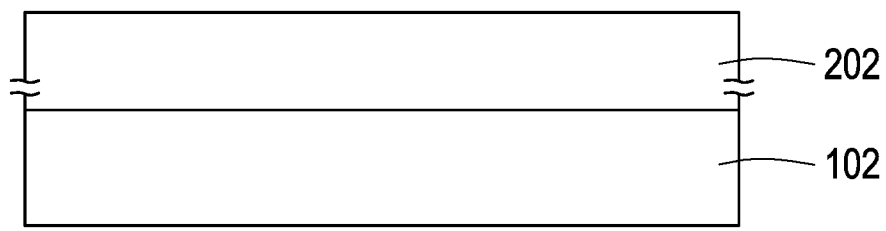
FIG. 2A to FIG. 2J are schematic perspective views illustrating various stages of a manufacturing method of a transistor shown in FIG. 1.

FIG. 2A to FIG. 2J are schematic perspective views illustrating various stages of a manufacturing method of a transistor shown in FIG. 1. Referring to FIG. 2A, a gate dielectric layer 202 is formed over the substrate 102 of the integrated circuit 100. In some embodiments, the gate dielectric layer 202 may be formed directly on the substrate 102 and contacting the substrate 102. Alternatively, there may be a plurality of dielectric layers DLX located in between the gate dielectric layer 202 and the substrate 102. In some embodiments, the gate dielectric layer 202 includes silicon oxide, silicon nitride, silicon oxynitride, or the like, which may be deposited by CVD, physical vapor deposition (PVD), atomic layer deposition (ALD), PECVD, or the like.

Figure 2B:
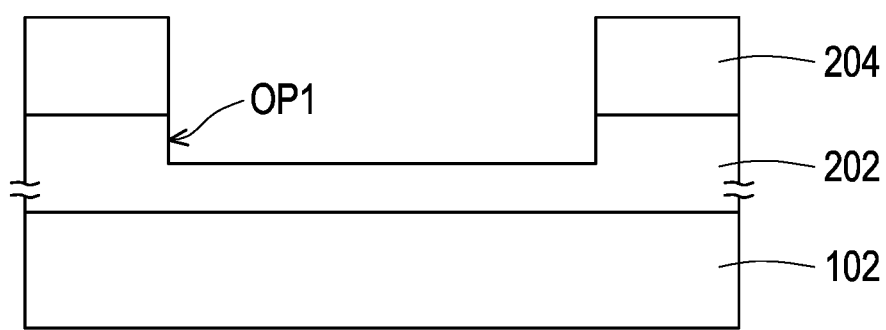

Referring to FIG. 2B, a photoresist pattern 204 is formed on the gate dielectric layer 202. The photoresist pattern 204 may include openings revealing portions of the gate dielectric layer 202. For example, the openings correspond to a shape of a gate electrode formed in subsequent steps. In other words, the shape of the photoresist pattern 204 is not particularly limited, and will depend on the design requirements of the gate electrode. In one embodiment, the photoresist pattern 204 may be formed by coating (such as spin-coating) and photolithography processes or the like; however, the disclosure is not limited thereto. A material of the photoresist pattern 204, for example, includes a positive resist material or a negative resist material, that is suitable for a patterning process such as a photolithography process with a mask or a mask-less photolithography process (for instance, an electron-beam (e-beam) writing or an ion-beam writing).

After providing the photoresist pattern 204 on the gate dielectric layer 202, an etching process is performed to remove portions of the gate dielectric layer 202. For example, portions of the gate dielectric layer 202 not covered by the photoresist pattern 204 are removed. In certain embodiments, the gate dielectric layer 202 is etched or patterned to form a first opening OP1. Although only one first opening OP1 is illustrated herein, it should be noted that the number of first openings OP1 formed in the gate dielectric layer 202 will correspond to the number of gate electrodes formed in the integrated circuit 100.

Figure 2C:
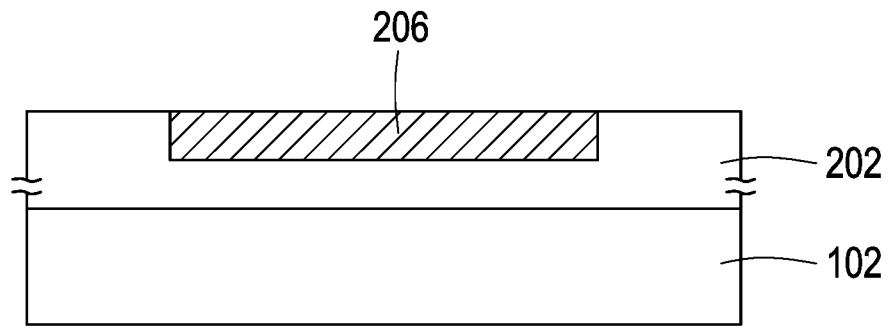

Referring to FIG. 2C, in a subsequent step, a gate electrode 206 is formed within the first opening OP1 of the gate dielectric layer 202. In some embodiments, the gate electrode 206 is formed in the first opening OP1 by filling the first opening OP1 with a conductive material, and a planarization process (e.g., a chemical-mechanical planarization (CMP) process) is performed to remove excessive conductive material, thereby forming the gate electrode 206. In certain embodiments, a top surface of the gate electrode 206 is coplanar with a top surface of the gate dielectric layer 202.

In some embodiments, the gate electrode 206 include conductive materials such as copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the gate electrode 206 also includes materials to fine-tune the corresponding work function. For example, the conductive material of the gate electrode 206 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof. In some embodiments, the conductive material of the gate electrode 206 is deposited through ALD, CVD, PVD, or the like.

Figure 2D:
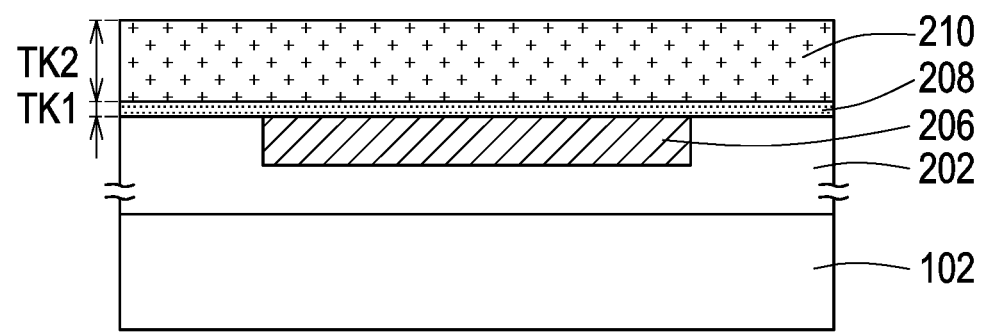

Referring to FIG. 2D, after forming the gate electrode 206, a gas impermeable layer 208 and a ferroelectric layer 210 (or high-K layer) are formed over the gate electrode 206. In one embodiment, the gas impermeable layer 208 is formed on the gate electrode 206 prior to forming the ferroelectric layer 210. For example, the gas impermeable layer 208 is formed on the gate electrode 206 and on the gate dielectric 202 through ALD, CVD, or the like. Thereafter, the ferroelectric layer 210 is formed on the gas impermeable layer 208 by ALD, CVD, or the like. In some embodiments, the gas impermeable layer 208 includes gas impermeable materials such as aluminum oxide, titanium oxide, a combination thereof, or the like. In certain embodiments, the gas impermeable layer 208 is impermeable to gases such as oxygen, water vapor, or the like. Although aluminum oxide and titanium oxide are used as examples of the gas impermeable layer 208, it is noted that other materials may be used as long as they are impermeable to gases such as oxygen, water vapor etc.

In another embodiment, the ferroelectric layer 210 is formed on the gate electrode 206 and on the gate dielectric 202 prior to forming the gas impermeable layer 208. For example, after forming the ferroelectric layer 210, the ferroelectric layer 210 may be heavily doped with aluminum ($Al^+$) or titanium ($Ti^+$) so that the gas impermeable layer 208 may be formed at the bottom of the ferroelectric layer 210. That is, after doping with aluminum ($Al^+$) or titanium ($Ti^+$), the gas impermeable layer 208 is formed between the ferroelectric layer 210 and the gate electrode 206.

In some embodiments, the ferroelectric layer 210 is located on the gas impermeable layer 208, and include materials that are capable of switching between two different polarization directions by applying an appropriate voltage differential across the ferroelectric layer 210. For example, the ferroelectric layer 210 includes a high-k dielectric material, such as a hafnium (Hf) based dielectric materials or the like. In some embodiments, the dielectric layer 90 includes hafnium oxide, hafnium zirconium oxide, aluminum hafnium zirconium oxide, silicon-doped hafnium oxide, or the like.

In some other embodiments, the ferroelectric layer 210 include materials such as barium titanium oxide ($BaTiO_3$), aluminum nitride ($AlN_x$) lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or the like. In some embodiments, the method of forming the ferroelectric layer 210 includes performing a suitable deposition technique, such as CVD, PECVD, metal oxide chemical vapor deposition (MOCVD), ALD, remote plasma atomic layer deposition (RPALD), plasma enhanced atomic layer deposition (PEALD), molecular beam deposition (MBD) or the like.

As further illustrated in FIG. 2D, the gas impermeable layer 208 is formed with a thickness of TK1, while the ferroelectric layer 210 is formed with a thickness of TK2. The thickness TK2 is greater than the thickness TK1. In some embodiments, a ratio of the thickness TK1 of the gas impermeable layer 208 to the thickness TK2 of the ferroelectric layer 210 is in a range of 1:5 to 1:20. In certain embodiments, when the thickness TK2 of the gas impermeable layer 208 is controlled in the above range, the gas impermeable function for preventing gas diffusion to the subsequently formed channel layer may be ensured.

Figure 2E:
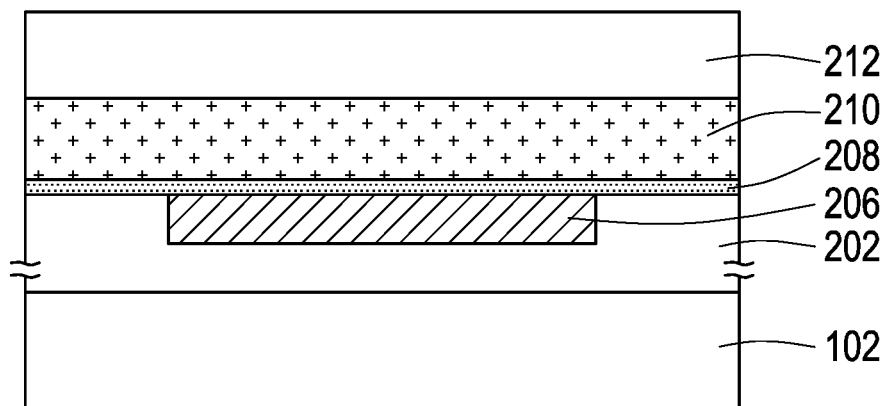

Referring to FIG. 2E, a channel layer 212 is formed over the ferroelectric layer 210. In some embodiments, the channel layer 212 is made of oxide semiconductor materials such as indium-gallium-zinc oxide (InGaZnO), gallium oxide ($Ga_2O_3$), indium oxide ($In_2O_3$), zinc oxide (ZnO), indium tin oxide (ITO), indium tungsten oxide (IWO), or the like. In some embodiments, the channel layer 212 is formed by any suitable method, such as atomic layer deposition (ALD), chemical vapor deposition (CVD), metal organic chemical vapor deposition (MOCVD), plasma enhanced chemical vapor deposition (PECVD), sputtering or the like. Furthermore, the channel layer 212 may be single crystalline, poly crystalline, or amorphous.

In some embodiments, since the gas impermeable layer 208 is separating the channel layer 212 from the gate electrode 206, the gate dielectric layer 202 and the substrate 102 located underneath, gas diffusion (e.g. water vapor) towards the channel layer 212 may be prevented. As such, large positive-bias-stress-induced threshold voltage shift due to oxygen and water absorption in the channel layer 212 may be prevented, and the transistor properties may be improved.

Figure 2F:
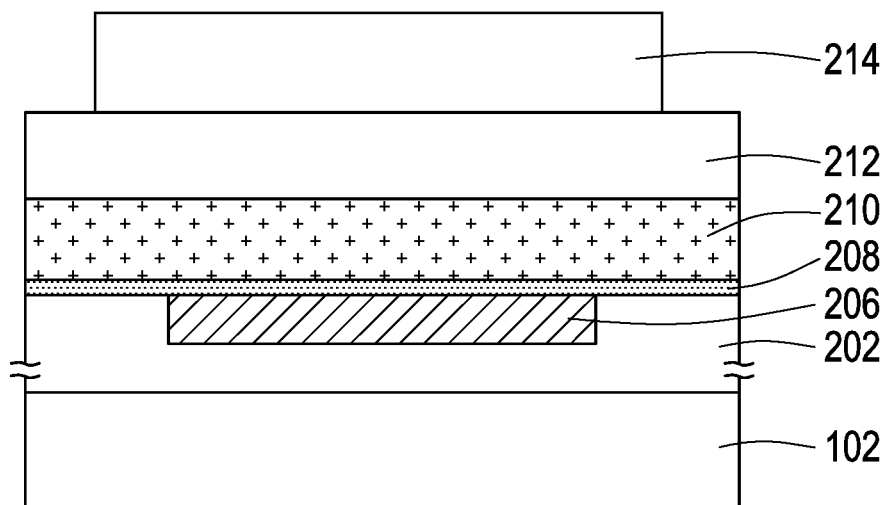

Referring to FIG. 2F, in a subsequent step, a photoresist pattern 214 is formed on the channel layer 212. The photoresist pattern 214 may cover portions of the channel layer 212, which is used to define a device region of the formed transistor. In one embodiment, the photoresist pattern 214 may be formed by coating (such as spin-coating) and photolithography processes or the like; however, the disclosure is not limited thereto. A material of the photoresist pattern 214, for example, includes a positive resist material or a negative resist material, that is suitable for a patterning process such as a photolithography process with a mask or a mask-less photolithography process (for instance, an electron-beam (e-beam) writing or an ion-beam writing).

Figure 2G:
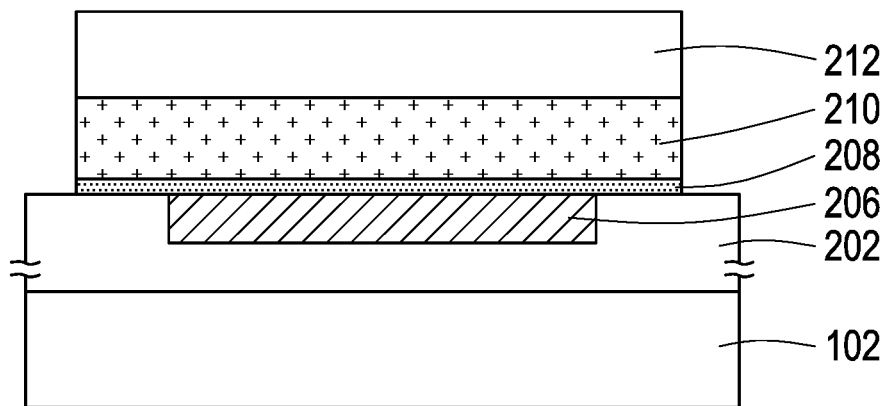

Referring to FIG. 2G, after providing the photoresist pattern 214, the channel layer 212, the ferroelectric layer 210 and the gas impermeable layer 208 may be patterned together. For example, portions of the channel layer 212, the ferroelectric layer 210 and the gas impermeable layer 208 not covered by the photoresist pattern 214 may be removed. After the patterning process, sidewalls of the channel layer 212 may be aligned with sidewalls of the ferroelectric layer 210 and sidewalls of the gas impermeable layer 208. Thereafter, the photoresist pattern 214 is removed.

Figure 2H:
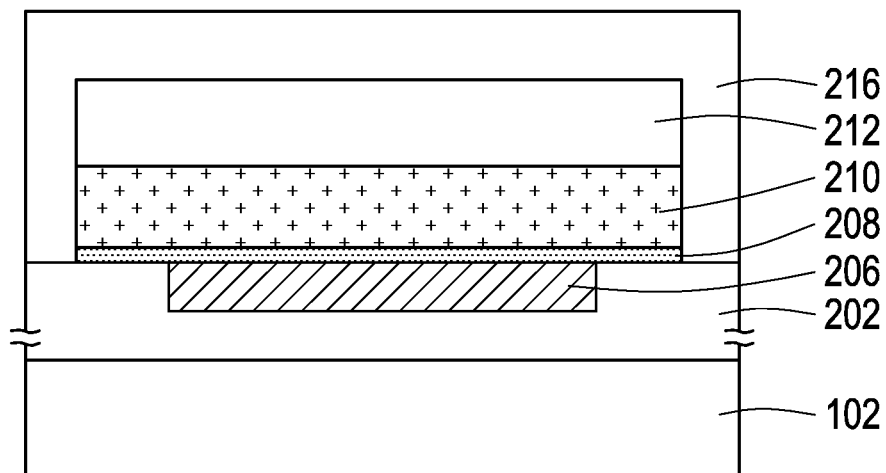

Referring to FIG. 2H, a dielectric layer 216 may be formed on the gate dielectric 202 to cover and surround the channel layer 212, the ferroelectric layer 210 and the gas impermeable layer 208. In some embodiments, the dielectric layer 216 include materials such as polyimide, epoxy resin, acrylic resin, phenol resin, benzocyclobutene (BCB), polybenzooxazole (PBO), or any other suitable polymer-based dielectric material. Alternatively, the dielectric layer 216 may be formed of oxides or nitrides, such as silicon oxide, silicon nitride, or the like. The dielectric layer 216 may be formed by suitable fabrication techniques such as spin-on coating, CVD, PECVD, or the like. In certain embodiments, the dielectric layer 216 corresponds to the dielectric layer DLX of the integrated circuit 100 (shown in FIG. 1).

Figure 2I:
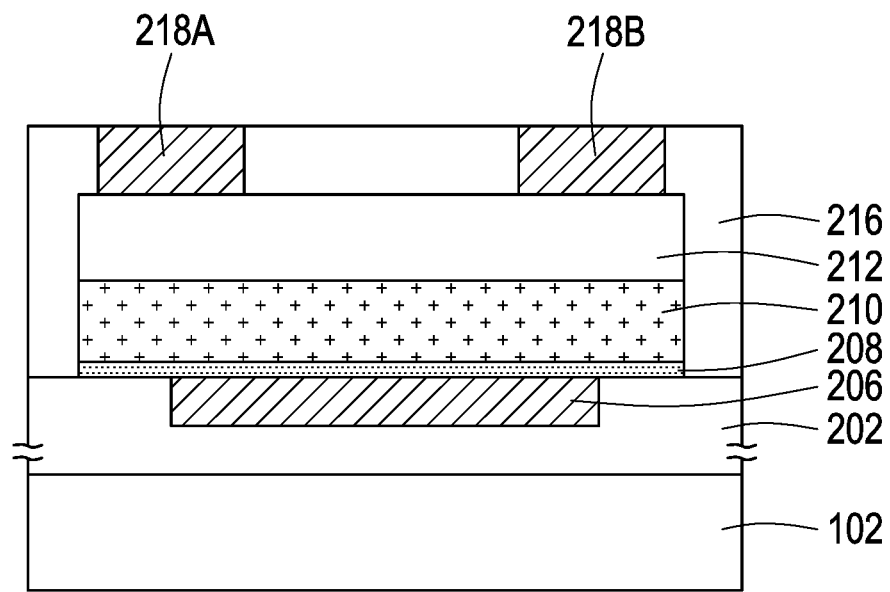

Referring to FIG. 2I, after forming the dielectric layer 216, the dielectric layer 216 may be patterned to form openings revealing the channel layer 212. Thereafter, a source line 218A and a bit line 218B are formed within the opening to be connected to the channel layer 212. In some embodiments, the source line 218A and the bit line 218B are surrounded by the dielectric layer 216. In certain embodiments, top surfaces of the source line 218A and the bit line 218B are aligned with a top surface of the dielectric layer 216. The source line 218A and the bit line 218B may be formed of conductive materials including copper, aluminum, tungsten, titanium nitride (TiN), tantalum nitride (TaN), some other conductive materials, or any combinations thereof. In some embodiments, the source line 218A and the bit line 218B are deposited through ALD, CVD, PVD, or the like.

Figure 2J:
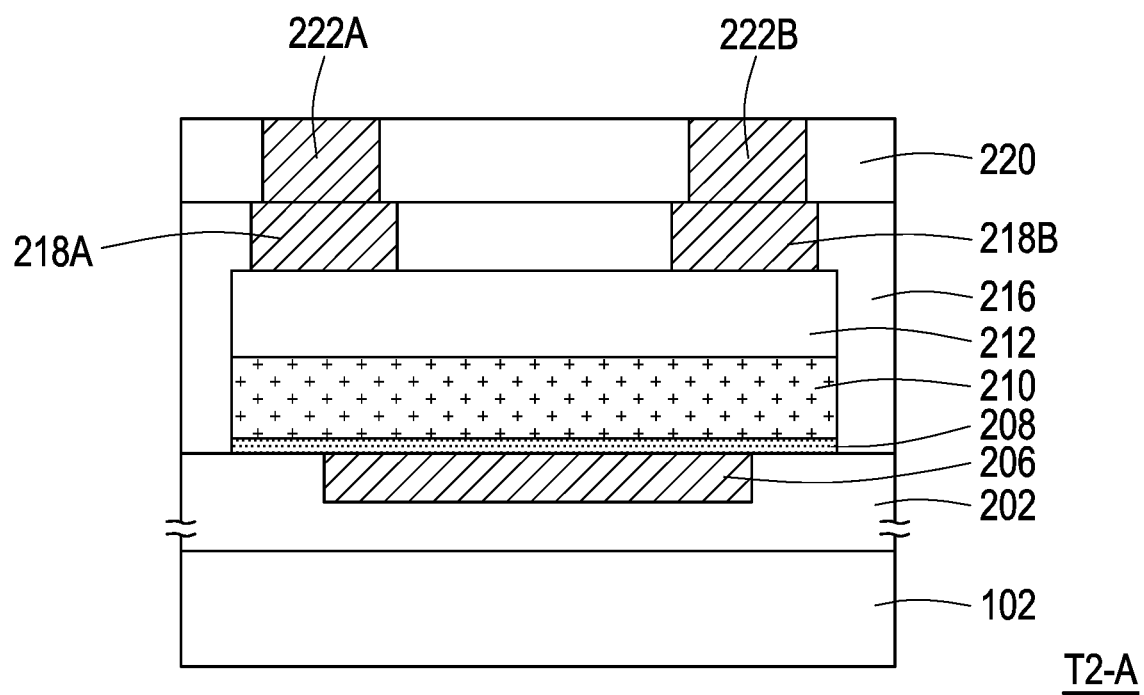

Referring to FIG. 2J, in a subsequent step, a passivation layer 220 is formed over the dielectric layer 216. The passivation layer 220 may be a silicon oxide layer, a silicon nitride layer, a silicon oxy-nitride layer, aluminum oxide layer, titanium oxide layer, or a dielectric layer formed of any suitable dielectric materials. The passivation layer 220 may be formed by CVD, PECVD, or the like. In some embodiments, the passivation layer 220 may be patterned to form openings revealing the source line 218A and the bit line 218B. Thereafter, a source line contact 222A and a bit line contact 222B may be formed in the openings to be electrically connected to the source line 218A and the bit line 218B.

In some embodiments, the source line contact 222A and the bit line contact 222B are formed by a similar material and similar process as with the source line 218A and the bit line 218B. Therefore, the details of the source line contact 222A and the bit line contact 222B will be omitted herein. In some embodiments, the source line contact 222A and the bit line contact 222B may be electrically connected to conductive layers CLX of the integrated circuit 100 (shown in FIG. 1). For example, the source line contact 222A and the bit line contact 222B may be electrically connected to the conductive vias CL1 of the conductive layers CLX. Up to here, a transistor T2-A in accordance with some embodiments of the present disclosure is accomplished.

Figure 3:
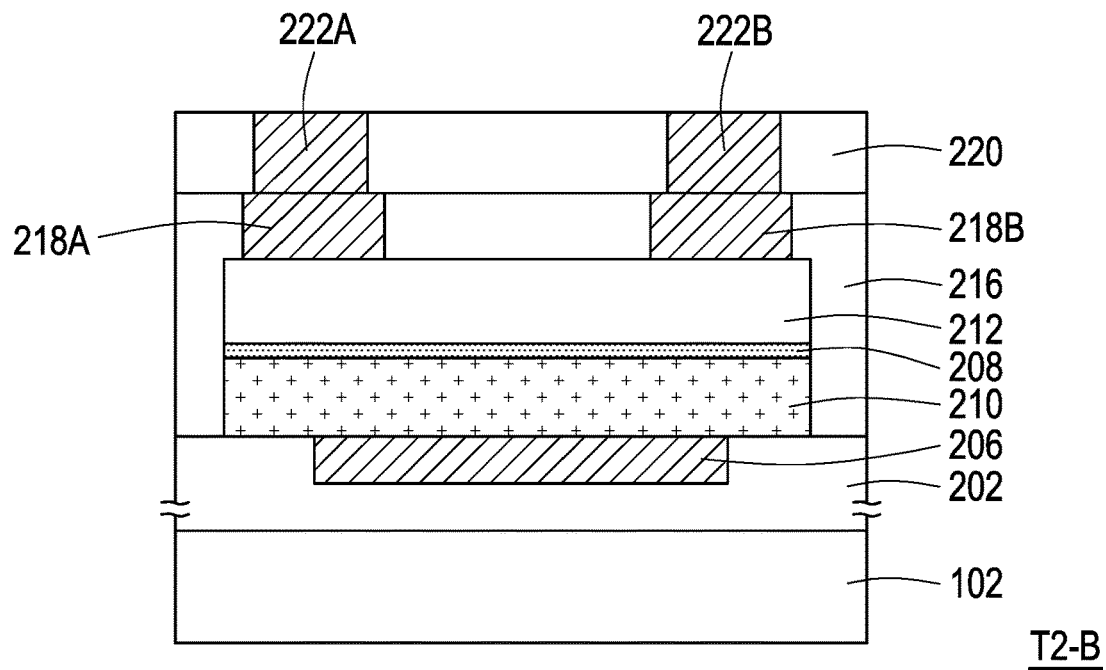
FIG. 3 is a schematic cross-sectional view of a transistor in accordance with some alternative embodiments of the present disclosure.

FIG. 3 is a schematic cross-sectional view of a transistor in accordance with some alternative embodiments of the present disclosure. The transistor T2-B illustrated in FIG. 3 is similar to the transistor T2-A illustrated in FIG. 2J. Therefore, the same reference numerals are used to refer to the same or liked parts, and its detailed description will be omitted herein. The difference between the embodiments is in the position of the gas impermeable layer 208.

As illustrated in FIG. 3, the gas impermeable layer 208 is formed above the ferroelectric layer 210 and sandwiched in between the ferroelectric layer 210 and the channel layer 212. The gas impermeable layer 208 is formed on the ferroelectric layer 210 by ALD, CVD, or the like. In the exemplary embodiment, since the gas impermeable layer 208 is separating the channel layer 212 from the gate electrode 206, the gate dielectric layer 202 and the substrate 102 located underneath, gas diffusion (e.g. water vapor) towards the channel layer 212 may be prevented. As such, large positive-bias-stress-induced threshold voltage shift due to oxygen and water absorption in the channel layer 212 may be prevented, and the transistor properties may be improved.

Figure 4:
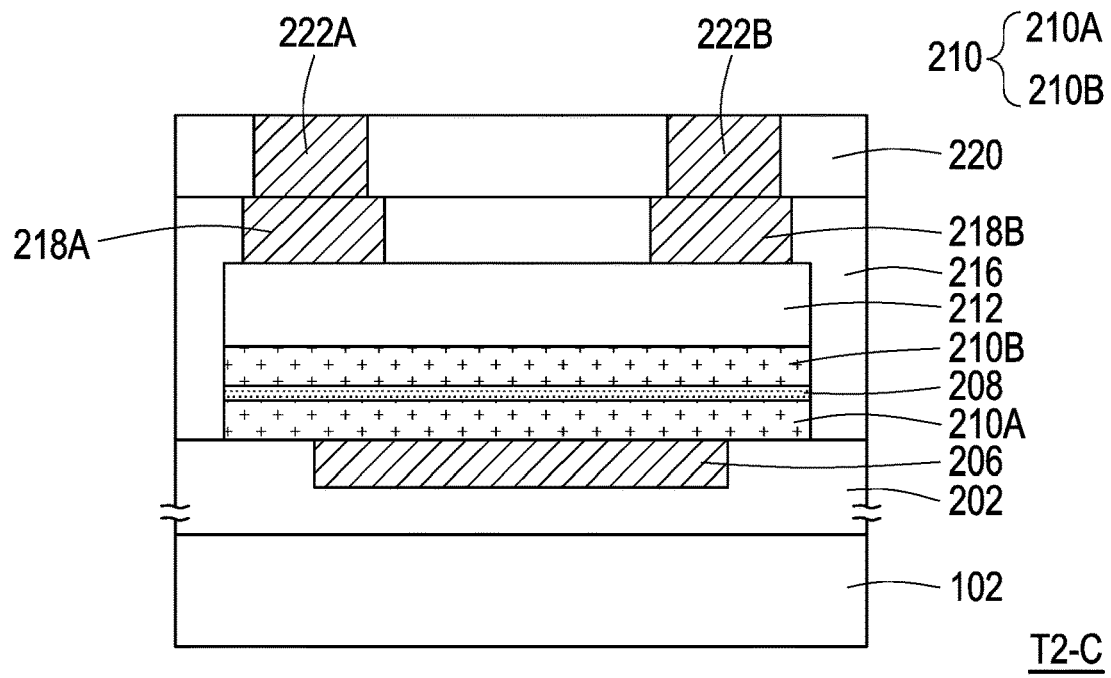
FIG. 4 is a schematic cross-sectional view of a transistor in accordance with some alternative embodiments of the present disclosure.

FIG. 4 is a schematic cross-sectional view of a transistor in accordance with some alternative embodiments of the present disclosure. The transistor T2-C illustrated in FIG. 4 is similar to the transistor T2-A illustrated in FIG. 2J. Therefore, the same reference numerals are used to refer to the same or liked parts, and its detailed description will be omitted herein. The difference between the embodiments is in the position of the gas impermeable layer 208.

As illustrated in FIG. 4, the gas impermeable layer 208 is an intermediate gas impermeable layer 208 located within the ferroelectric layer 210. For example, the intermediate gas impermeable layer 208 separates the ferroelectric layer 210 into a first sub-layer 210A and a second sub-layer 210B. The first sub-layer 210A is sandwiched between the gate electrode 206 and the intermediate gas impermeable layer 208, while the second sub-layer 210B is sandwiched between the channel layer 212 and the intermediate gas impermeable layer 208. In the exemplary embodiment, since the intermediate gas impermeable layer 208 is separating the channel layer 212 from the gate electrode 206, the gate dielectric layer 202 and the substrate 102 located underneath, gas diffusion (e.g. water vapor) towards the channel layer 212 may be prevented. As such, large positive-bias-stress-induced threshold voltage shift due to oxygen and water absorption in the channel layer 212 may be prevented, and the transistor properties may be improved.

Figure 5:
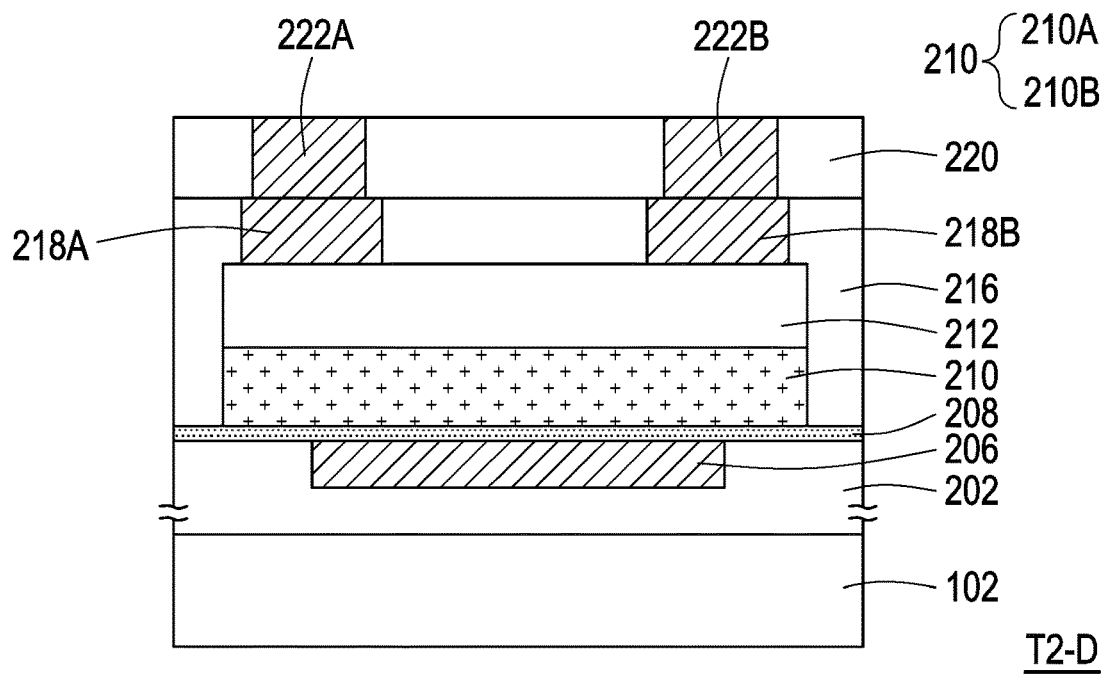
FIG. 5 is a schematic cross-sectional view of a transistor in accordance with some alternative embodiments of the present disclosure.

FIG. 5 is a schematic cross-sectional view of a transistor in accordance with some alternative embodiments of the present disclosure. The transistor T2-D illustrated in FIG. 5 is similar to the transistor T2-A illustrated in FIG. 2J. Therefore, the same reference numerals are used to refer to the same or liked parts, and its detailed description will be omitted herein. The difference between the embodiments is in the design of the gas impermeable layer 208.

As illustrated in FIG. 5, the gas impermeable layer 208 is located in between the gate electrode 206 and the ferroelectric layer 210. However, sidewalls of the gas impermeable layer 208 are non-aligned with sidewalls of the channel layer 212 and sidewalls of the ferroelectric layer 210. In some embodiments, the gas impermeable layer 208 entirely covers top surfaces of the gate electrode 206 and the gate dielectric layer 202. In the exemplary embodiment, since the gas impermeable layer 208 is separating the channel layer 212 from the gate electrode 206, the gate dielectric layer 202 and the substrate 102 located underneath, gas diffusion (e.g. water vapor) towards the channel layer 212 may be prevented. Furthermore, the gas impermeable layer 208 entirely covers the gate electrode 206 and the gate dielectric layer 202, thus the blocking of the gas diffusion route may be further ensured. As such, large positive-bias-stress-induced threshold voltage shift due to oxygen and water absorption in the channel layer 212 may be prevented, and the transistor properties may be improved.

Figure 6:
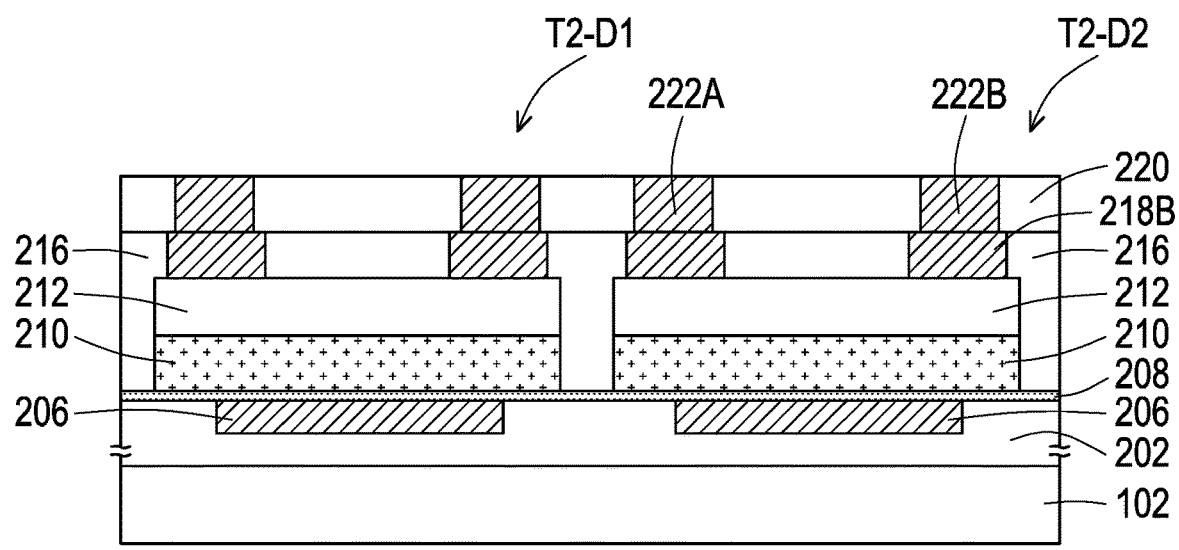
FIG. 6 is a schematic cross-sectional view of a portion of a transistor array in accordance with some embodiments of the present disclosure.

FIG. 6 is a schematic cross-sectional view of a portion of a transistor array in accordance with some embodiments of the present disclosure. The transistor array AR1 illustrated in FIG. 6 may include a plurality of the transistor T2-D illustrated in FIG. 5. Therefore, the same reference numerals are used to refer to the same or liked parts, and its detailed description will be omitted herein.

In the transistor array AR1 illustrated in FIG. 6, a first transistor T2-D1 and a second transistor T2-D2 are included. The first transistor T2-D1 and the second transistor T2-D2 are similar to the transistor T2-D illustrated in FIG. 5, whereby sidewalls of the gas impermeable layer 208 are non-aligned with sidewalls of the channel layer 212 and sidewalls of the ferroelectric layer 210. Furthermore, it is noted that the gas impermeable layer 208 is shared between the first transistor T2-D1 and the second transistor T2-D2. That is, the gas impermeable layer 208 extends from a position below the ferroelectric layer 210 of the first transistor T2-D1, towards a position below the ferroelectric layer 210 of the second transistor T2-D2.

In the exemplary embodiment, since the gas impermeable layer 208 is separating the channel layer 212 from the gate electrode 206, the gate dielectric layer 202 and the substrate 102 located underneath in both transistors (T2-D1, T2-D2), gas diffusion (e.g. water vapor) towards the channel layer 212 may be prevented. Furthermore, the gas impermeable layer 208 entirely covers the gate electrode 206 and the gate dielectric layer 202, thus the blocking of the gas diffusion route may be further ensured. As such, large positive-bias-stress-induced threshold voltage shift due to oxygen and water absorption in the channel layer 212 may be prevented, and the transistor properties may be further improved.

Figure 7:
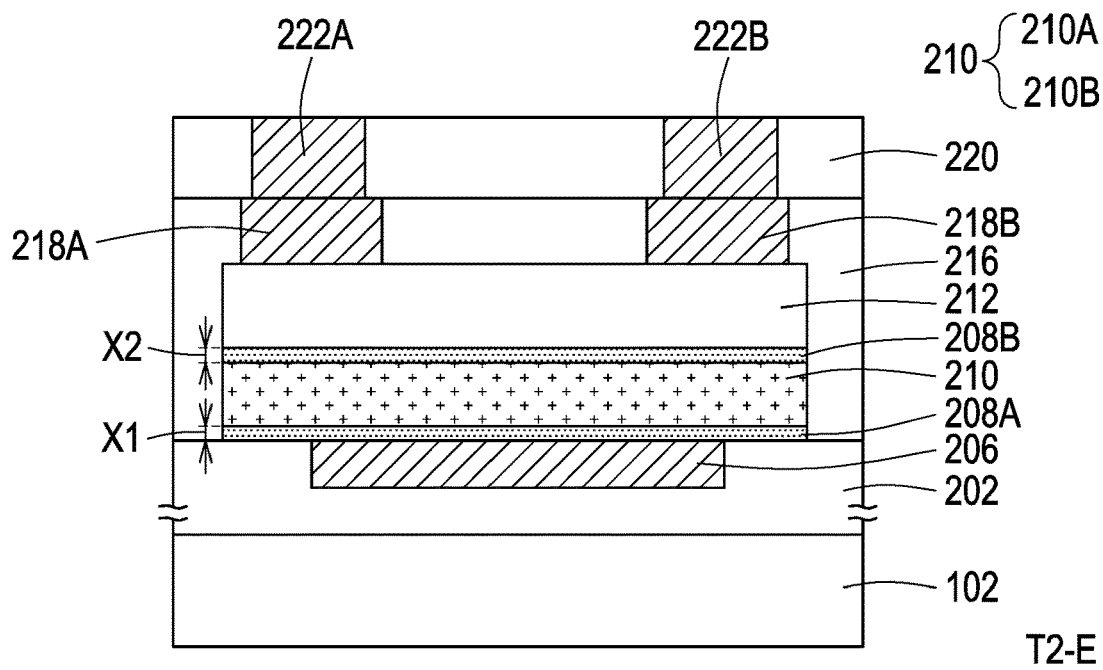
FIG. 7 is a schematic cross-sectional view of a transistor in accordance with some alternative embodiments of the present disclosure.

FIG. 7 is a schematic cross-sectional view of a transistor in accordance with some alternative embodiments of the present disclosure. The transistor T2-E illustrated in FIG. 7 is similar to the transistor T2-A illustrated in FIG. 2J. Therefore, the same reference numerals are used to refer to the same or liked parts, and its detailed description will be omitted herein. The difference between the embodiments is that a second gas impermeable layer is further included.

As illustrated in FIG. 7, the gas impermeable layer 208A is sandwiched in between the ferroelectric layer 210 and the gate electrode 206, and the second gas impermeable layer 208B is sandwiched in between ferroelectric layer 210 and the channel layer 212. The gas impermeable layer 208A and the second gas impermeable layer 208B may be formed by similar method through ALD, CVD, or the like. In some embodiments, the gas impermeable layer 208A and the second gas impermeable layer 208B are made of different materials. For example, one may include aluminum oxide, while the other one may include titanium oxide. In some alternative embodiments, the gas impermeable layer 208A and the second gas impermeable layer 208B are made of the same material.

As further illustrated in FIG. 7, the gas impermeable layer 208A may have a thickness of X1, while the second gas impermeable layer 208B may have a thickness of X2. In the exemplary embodiment, the thickness X1 of the gas impermeable layer 208A is different than the thickness X2 of the second gas impermeable layer 208B. For example, the thickness X1 is greater than the thickness X2. However, the disclosure is not limited thereto. In some alternative embodiments, the thickness X1 is substantially equal to the thickness X2.

In the exemplary embodiment, since the gas impermeable layer 208A is separating the channel layer 212 from the gate electrode 206, the gate dielectric layer 202 and the substrate 102 located underneath, gas diffusion (e.g. water vapor) towards the channel layer 212 may be prevented. Furthermore, the second gas impermeable layer 208B is separating the channel layer 212 from the components below, thus the blocking of the gas diffusion route may be further ensured. As such, large positive-bias-stress-induced threshold voltage shift due to oxygen and water absorption in the channel layer 212 may be prevented, and the transistor properties may be further improved.

Figure 8:
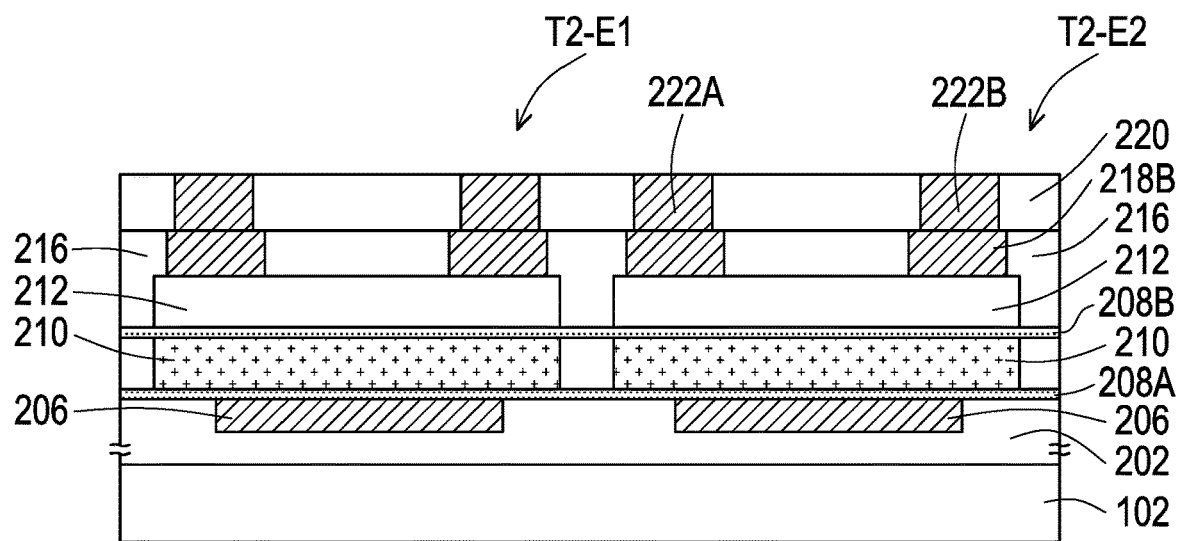
FIG. 8 is a schematic cross-sectional view of a portion of a transistor array in accordance with some alternative embodiments of the present disclosure.

FIG. 8 is a schematic cross-sectional view of a portion of a transistor array in accordance with some alternative embodiments of the present disclosure. The transistor array AR2 illustrated in FIG. 8 is similar to the transistor AR1 illustrated in FIG. 6. Therefore, the same reference numerals are used to refer to the same or liked parts, and its detailed description will be omitted herein. The difference between the embodiments is that a second gas impermeable layer is further included.

As illustrated in the transistor array AR2 of FIG. 8, a first transistor T2-E1 and a second transistor T2-E2 are included. The first transistor T2-E1 and the second transistor T2-E2 are similar to the transistor T2-D illustrated in FIG. 5, whereby sidewalls of the gas impermeable layer 208A are non-aligned with sidewalls of the channel layer 212 and sidewalls of the ferroelectric layer 210. Furthermore, a second gas impermeable layer 208B is included, whereby sidewalls of the second gas impermeable layer 208B are non-aligned with sidewalls of the channel layer 212 and sidewalls of the ferroelectric layer 210. Both the gas impermeable layer 208A and the second gas impermeable layer 208B are shared between the first transistor T2-E1 and the second transistor T2-E2.

In the exemplary embodiment, since the gas impermeable layer 208A and the second gas impermeable layer 208B are separating the channel layer 212 from the underneath components in both transistors (T2-E1, T2-E2), gas diffusion (e.g. water vapor) towards the channel layer 212 may be prevented. Furthermore, the gas impermeable layer 208A entirely covers the gate electrode 206 and the gate dielectric layer 202, while the second gas impermeable layer 208B entirely covers the ferroelectric layer 210, thus the blocking of the gas diffusion route may be further ensured. As such, large positive-bias-stress-induced threshold voltage shift due to oxygen and water absorption in the channel layer 212 may be prevented, and the transistor properties may be further improved.

Figure 9:
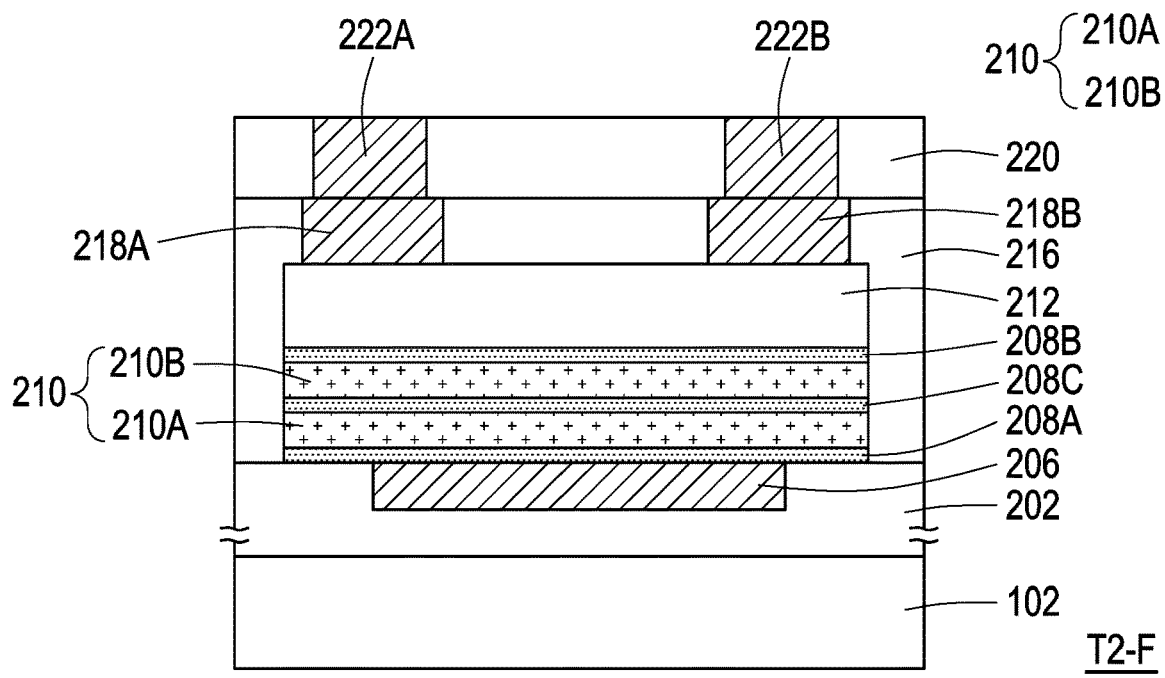
FIG. 9 is a schematic cross-sectional view of a transistor in accordance with some alternative embodiments of the present disclosure.

FIG. 9 is a schematic cross-sectional view of a transistor in accordance with some alternative embodiments of the present disclosure. The transistor T2-F illustrated in FIG. 9 is similar to the transistor T2-E illustrated in FIG. 7. Therefore, the same reference numerals are used to refer to the same or liked parts, and its detailed description will be omitted herein. The difference between the embodiments is that an intermediate gas impermeable layer is further included.

As illustrated in FIG. 9, the gas impermeable layer 208A is sandwiched in between the ferroelectric layer 210 and the gate electrode 206, and the second gas impermeable layer 208B is sandwiched in between ferroelectric layer 210 and the channel layer 212. Furthermore, an intermediate gas impermeable layer 208C is disposed in between the gas impermeable layer 208A and the second gas impermeable layer 208B within the ferroelectric layer 210. For example, the intermediate gas impermeable layer 208C separates the ferroelectric layer 210 into a first sub-layer 210A and a second sub-layer 210B.

In the exemplary embodiment, since the gas impermeable layer 208A is separating the channel layer 212 from the gate electrode 206, the gate dielectric layer 202 and the substrate 102 located underneath, gas diffusion (e.g. water vapor) towards the channel layer 212 may be prevented. Furthermore, the second gas impermeable layer 208B and the intermediate gas impermeable layer 208C are further separating the channel layer 212 from the components below, thus the blocking of the gas diffusion route may be further ensured. As such, large positive-bias-stress-induced threshold voltage shift due to oxygen and water absorption in the channel layer 212 may be prevented, and the transistor properties may be further improved.

Figure 10:
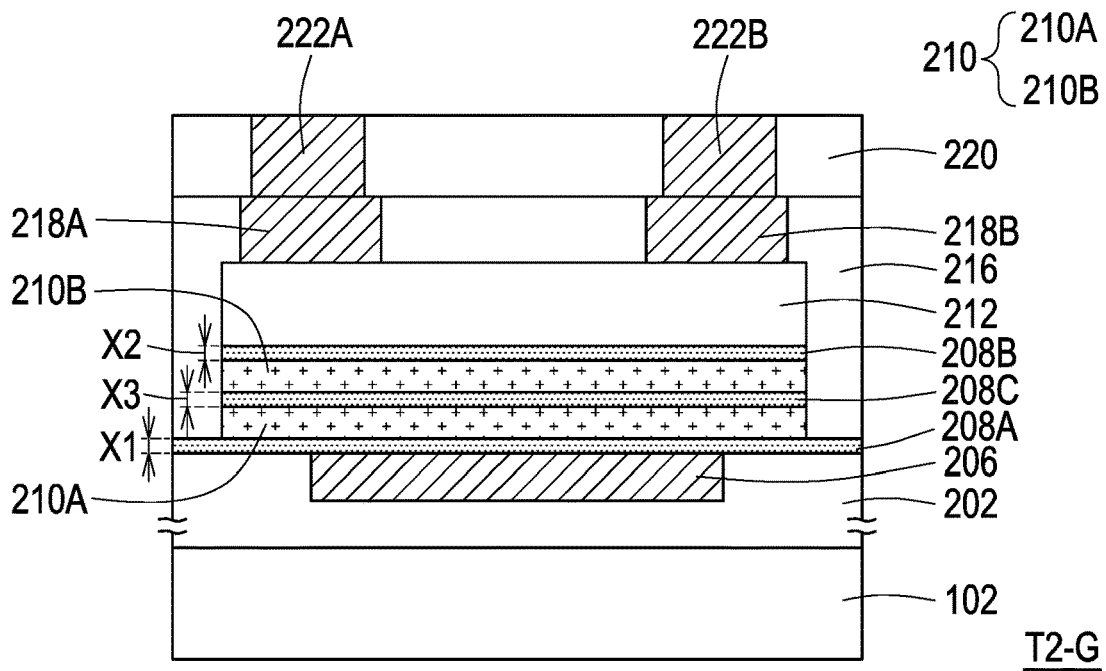
FIG. 10 is a schematic cross-sectional view of a transistor in accordance with some alternative embodiments of the present disclosure.

FIG. 10 is a schematic cross-sectional view of a transistor in accordance with some alternative embodiments of the present disclosure. The transistor T2-G illustrated in FIG. 10 is similar to the transistor T2-F illustrated in FIG. 9. Therefore, the same reference numerals are used to refer to the same or liked parts, and its detailed description will be omitted herein. The difference between the embodiments is in the design of the gas impermeable layer 208A.

As illustrated in FIG. 10, besides having the gas impermeable layer 208A, the second gas impermeable layer 208B and an intermediate gas impermeable layer 207C, it is noted that the sidewalls of the gas impermeable layer 208A are non-aligned with sidewalls of the channel layer 212 and sidewalls of the ferroelectric layer 210. In other words, the gas impermeable layer 208A of the transistor T2-G may extend towards and be shared with another transistor (not shown). In some embodiments, the gas impermeable layer 208A has a thickness of X1, the intermediate gas impermeable layer 208C has a thickness of X3 and the second gas impermeable layer 208B has a thickness of X2, whereby the thickness X1, the thickness X2 and the thickness X3 may be the same or different. In one embodiment, the thickness X1 is greater than the thickness X3, and the thickness X3 is greater than the X2. In other words, the gas impermeable layer 208A, the intermediate gas impermeable layer 208C and the second gas impermeable layer 208B may have decreasing thickness in the build-up direction of the transistor T2-G.

In the exemplary embodiment, since the gas impermeable layer 208A is separating the channel layer 212 from the gate electrode 206, the gate dielectric layer 202 and the substrate 102 located underneath, gas diffusion (e.g. water vapor) towards the channel layer 212 may be prevented. Furthermore, the second gas impermeable layer 208B and the intermediate gas impermeable layer 208C are further separating the channel layer 212 from the components below, thus the blocking of the gas diffusion route may be further ensured. As such, large positive-bias-stress-induced threshold voltage shift due to oxygen and water absorption in the channel layer 212 may be prevented, and the transistor properties may be further improved.

Figure 11:
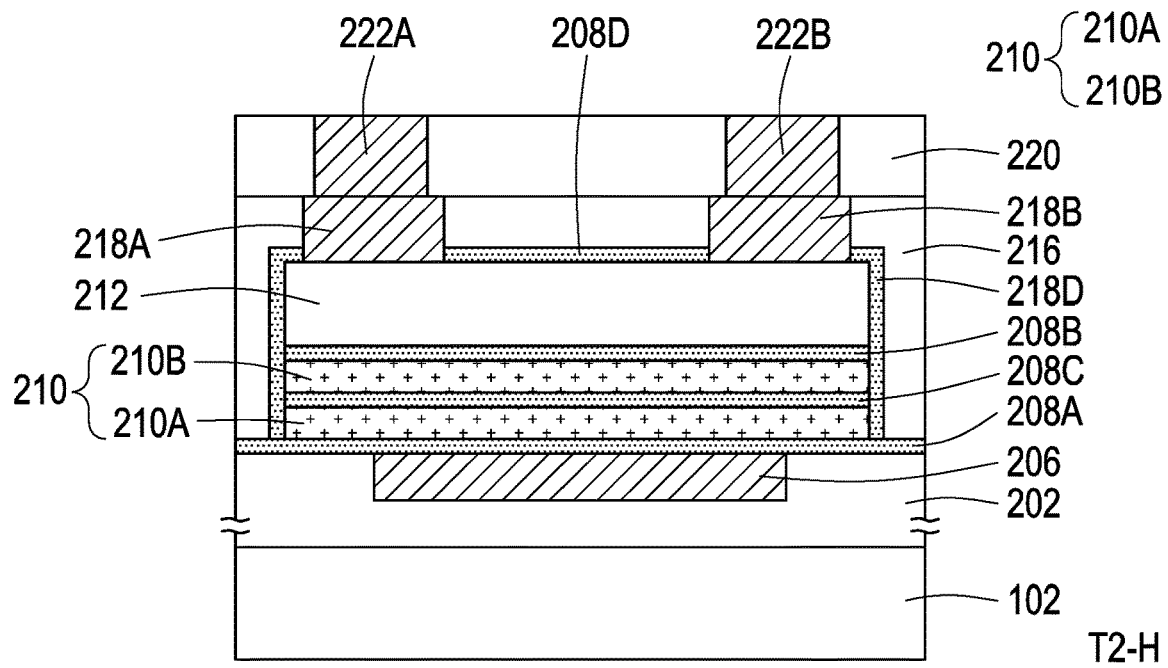
FIG. 11 is a schematic cross-sectional view of a transistor in accordance with some alternative embodiments of the present disclosure.

FIG. 11 is a schematic cross-sectional view of a transistor in accordance with some alternative embodiments of the present disclosure. The transistor T2-H illustrated in FIG. 11 is similar to the transistor T2-G illustrated in FIG. 10. Therefore, the same reference numerals are used to refer to the same or liked parts, and its detailed description will be omitted herein. The difference between the embodiments is that a capping layer is further provided.

As illustrated in FIG. 11, besides having the gas impermeable layer 208A, the second gas impermeable layer 208B and an intermediate gas impermeable layer 207C, the transistor T2-H further includes a capping layer 208D. The capping layer 208D is disposed on sidewalls of the channel layer 212 and the ferroelectric layer 210, and joining the gas impermeable layer 208A to the second gas impermeable layer 208B and the intermediate gas impermeable layer 208C. Furthermore, the capping layer 208D is disposed on top surfaces of the channel layer 212 to surround the channel layer 212. In some embodiments, the capping layer 208D is made of the same gas impermeable material as the gas impermeable layer 208A, and may be formed by ALD, CVD, or the like.

In the exemplary embodiment, since the gas impermeable layer 208A is separating the channel layer 212 from the gate electrode 206, the gate dielectric layer 202 and the substrate 102 located underneath, gas diffusion (e.g. water vapor) towards the channel layer 212 may be prevented. Furthermore, the second gas impermeable layer 208B and the intermediate gas impermeable layer 208C are further separating the channel layer 212 from the components below, while the capping layer 208D at least surrounds the channel layer 212, thus the blocking of the gas diffusion route towards the channel layer 212 may be further ensured. As such, large positive-bias-stress-induced threshold voltage shift due to oxygen and water absorption in the channel layer 212 may be prevented, and the transistor properties may be further improved.

Figure 12:
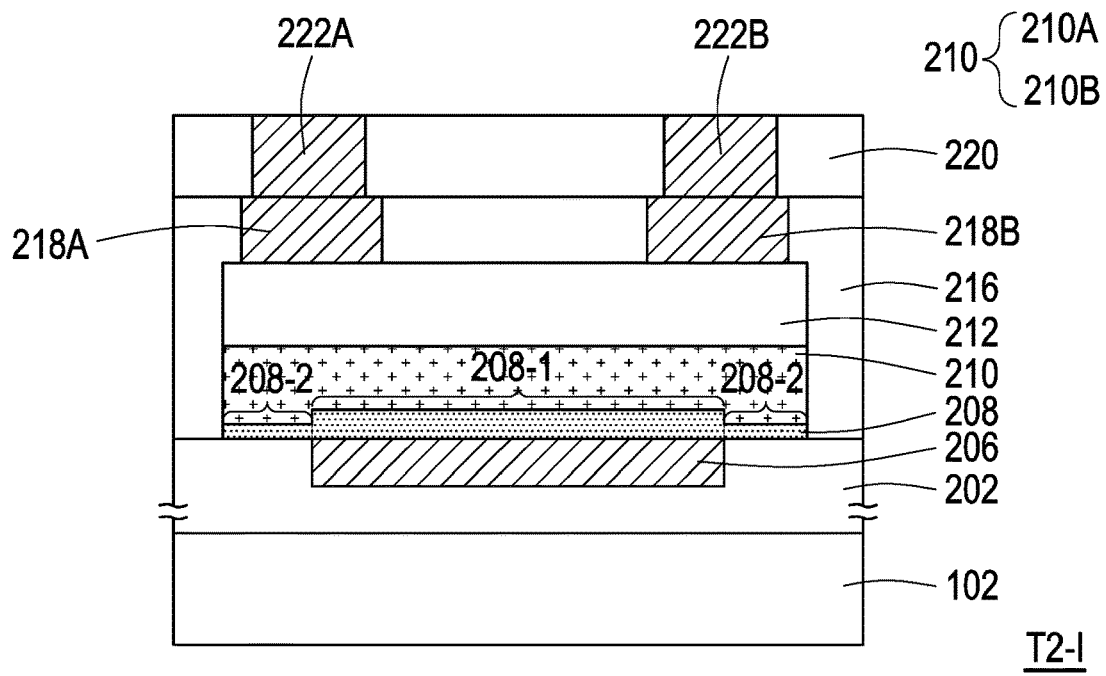
FIG. 12 is a schematic cross-sectional view of a transistor in accordance with some alternative embodiments of the present disclosure.

FIG. 12 is a schematic cross-sectional view of a transistor in accordance with some alternative embodiments of the present disclosure. The transistor T2-I illustrated in FIG. 12 is similar to the transistor T2-A illustrated in FIG. 2J. Therefore, the same reference numerals are used to refer to the same or liked parts, and its detailed description will be omitted herein. The difference between the embodiments is in the design of the gas impermeable layer 208.

As illustrated in FIG. 12, in some embodiments, the gas impermeable layer 208 of the transistor T2-I includes a first portion 208-1 and a second portion 208-2. For example, the first portion 208-1 is disposed in between the gate electrode 206 and the ferroelectric layer 210, and the second portion 208-2 is disposed in between the gate dielectric layer 202 and the ferroelectric layer 210. The second portion 208-2 surrounds the first portion 208-1, and a thickness of the first portion 208-1 is greater than a thickness of the second portion 208-2. The thicker first portion 208-1 may be formed by first forming a first layer of gas impermeable material over the gate electrode 206 and the gate dielectric layer 202, then selectively forming another layer of gas impermeable material over the area overlapped with the gate electrode 206.

In the exemplary embodiment, since the gas impermeable layer 208 is separating the channel layer 212 from the gate electrode 206, the gate dielectric layer 202 and the substrate 102 located underneath, gas diffusion (e.g. water vapor) towards the channel layer 212 may be prevented. As such, large positive-bias-stress-induced threshold voltage shift due to oxygen and water absorption in the channel layer 212 may be prevented, and the transistor properties may be improved.

Figure 13:
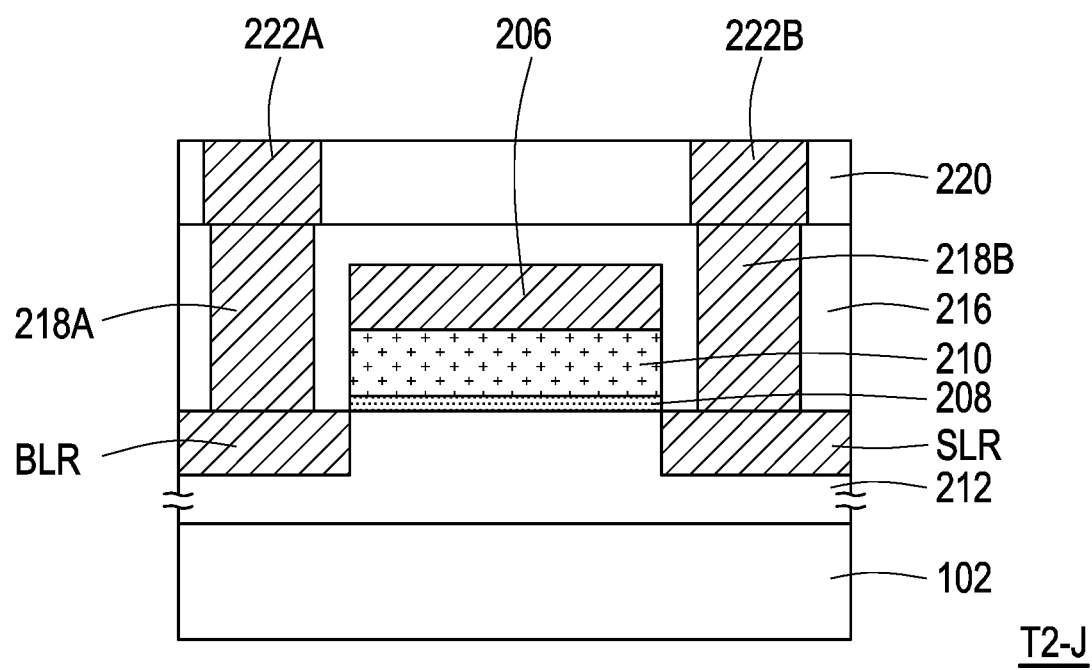
FIG. 13 is a schematic cross-sectional view of a transistor in accordance with some alternative embodiments of the present disclosure.

FIG. 13 is a schematic cross-sectional view of a transistor in accordance with some alternative embodiments of the present disclosure. The transistor T2-J illustrated in FIG. 13 is similar to the transistor T2-A illustrated in FIG. 2J. Therefore, the same reference numerals are used to refer to the same or liked parts, and its detailed description will be omitted herein. The difference between the embodiments is that the transistor T2-A has a bottom-gate structure, while the transistor T2-J has a top-gate structure.

As illustrated in the transistor T2-J of FIG. 13, the channel layer 212 is disposed over the substrate 102. In some embodiments, a bit line region BLR and a source line region SLR are disposed on two sides of the channel layer 212. The bit line region BLR and the source line region SLR may be formed of conductive materials including copper, aluminum, tungsten, titanium nitride (TiN), tantalum nitride (TaN), some other conductive materials, or any combinations thereof. In some embodiments, the bit line region BLR and the source line region SLR are deposited through ALD, CVD, PVD, or the like.

In some embodiments, the gas impermeable layer 208 is disposed on the channel layer 212 and covering top surfaces of the channel layer 212. The ferroelectric layer 210 and the gate electrode 206 are sequentially formed over the gas impermeable layer 208. In other words, the gas impermeable layer 208 is separating the channel layer 212 from the ferroelectric layer 210 and the gate electrode 206. In some embodiments, the source line 218A and the bit line 218B are disposed aside the gas impermeable layer 208, the ferroelectric layer 210 and the gate electrode 206, whereby the source line 218A and the bit line 218B are electrically connected to the source line region SLR and the bit line region BLR respectively.

As further illustrated in FIG. 13, the dielectric layer 216 is disposed on the channel layer 212 and over the bit line region BLR and the source line region SLR. For example, the dielectric layer 216 is surrounding the source line 218A, the bit line 218B, the gas impermeable layer 208, the ferroelectric layer 210 and the gate electrode 206. In certain embodiments, the passivation layer 220 is formed over the dielectric layer 216, and the source line contact 222A and bit line contact 222B are embedded in the dielectric layer 216 to be electrically connected to the source line 218A and the bit line 218B.

In the exemplary embodiment, since the gas impermeable layer 208 is separating the channel layer 212 from the above components, gas diffusion (e.g. water vapor) towards the channel layer 212 may be prevented. As such, large positive-bias-stress-induced threshold voltage shift due to oxygen and water absorption in the channel layer 212 may be prevented, and the transistor properties may be improved.

In the above embodiments, a single transistor, or a transistor array having two transistors are illustrated. However, it is noted that the transistor array may in fact include more than two transistors. In case where two or more transistors exist in the transistor array, each of the transistors in the transistor array may independently be the transistor T2-A, the transistor T2-B, the transistor T2-C, the transistor T2-D, the transistor T2-E, the transistor T2-F, the transistor T2-G, the transistor T2-H, the transistor T2-I, or the transistor T2-J. In other words, any combination of the above transistors may be included in the transistor array of the embodiments. In one embodiment, a transistor array including all of the transistor T2-A, the transistor T2-B, the transistor T2-C, the transistor T2-D, the transistor T2-E, the transistor T2-F, the transistor T2-G, the transistor T2-H, the transistor T2-I, or the transistor T2-J may be exemplified.

In the above-mentioned embodiments, a transistor is provided in an integrated circuit. The transistor includes at least one gas impermeable layer separating the channel layer from above or below components so as to prevent the diffusion of gas (e.g. water vapor) towards the channel layer. As such, large positive-bias-stress-induced threshold voltage shift due to oxygen and water absorption in the channel layer may be prevented, and the transistor will have better reliability and improved properties.

In accordance with some embodiments of the present disclosure, a transistor includes a gate electrode, a ferroelectric layer, a channel layer, a gas impermeable layer, a dielectric layer, a source line and a bit line. The ferroelectric layer is disposed on the gate electrode. The channel layer is disposed on the ferroelectric layer. The gas impermeable layer is disposed in between the channel layer and the gate electrode, and in contact with the ferroelectric layer. The dielectric layer is surrounding the ferroelectric layer and the channel layer, and in contact with the gas impermeable layer. The source line and the bit line are embedded in the dielectric layer and connected to the channel layer.

In accordance with some other embodiments of the present disclosure, an integrated circuit includes a substrate, an interconnection layer and at least one transistor. The interconnection layer is disposed on the substrate, wherein the interconnection layer includes a plurality of dielectric layers and a plurality of conductive layers alternately stacked up along a build-up direction. The transistor is located in between the plurality of dielectric layers, wherein the transistor includes a gate electrode, a gas impermeable layer, a ferroelectric layer and a channel layer sequentially stacked up along the build-up direction. The gas impermeable layer physically separates the gate electrode from the ferroelectric layer. At least one of the plurality of dielectric layers is surrounding the ferroelectric layer and the channel layer.

In accordance with yet another embodiment of the present disclosure, a method of fabricating a transistor is described. The method includes the following steps. A gate dielectric layer is formed over a substrate. The gate dielectric layer is patterned and a gate electrode is formed in the gate dielectric layer. A gas impermeable layer and a ferroelectric layer are formed over the gate dielectric layer and the gate electrode, wherein the gas impermeable layer is formed between the ferroelectric layer and the gate electrode while being in contact with the ferroelectric layer. A channel layer is formed on the ferroelectric layer. A dielectric layer is formed to surround the ferroelectric layer and the channel layer, and being in contact with the gas impermeable layer. A source line and a bit line are formed in the dielectric layer and connected to the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a transistor, comprising:
   forming a gate dielectric layer over a substrate;
   patterning the gate dielectric layer and forming a gate electrode in the gate dielectric layer;
   forming a gas impermeable layer and a ferroelectric layer over the gate dielectric layer and the gate electrode, wherein the gas impermeable layer is formed between the ferroelectric layer and the gate electrode while being in contact with the ferroelectric layer;
   forming a channel layer on the ferroelectric layer;
   forming a dielectric layer surrounding the ferroelectric layer and the channel layer, and in contact with the gas impermeable layer; and
   forming a source line and a bit line in the dielectric layer and connected to the channel layer.

2. The method according to claim 1, wherein the gas impermeable layer is formed by doping the ferroelectric layer with aluminum or titanium.

3. The method according to claim 1, wherein the gas impermeable layer is formed prior to forming the ferroelectric layer, and the gas impermeable layer is formed by atomic layer deposition (ALD) or chemical vapor deposition (CVD).

4. The method according to claim 1, further comprising forming a second gas impermeable layer on the ferroelectric layer prior to forming the channel layer, and forming the channel layer on the second gas impermeable layer.

5. The method according to claim 4, further comprising forming a capping layer on sidewalls of the channel layer and the ferroelectric layer, and joining the gas impermeable layer to the second gas impermeable layer.

6. The method according to claim 4, further comprising forming an intermediate gas impermeable layer located in the ferroelectric layer and in between the gas impermeable layer and the second gas impermeable layer, wherein the intermediate gas impermeable layer separates the ferroelectric layer into a first sub-layer and a second sub-layer.

7. The method according to claim 1, wherein the gas impermeable layer comprises, aluminum oxide, titanium oxide, or a combination thereof.

8. A method of fabricating an integrated circuit, comprising:
   providing a substrate;
   forming an interconnection layer on the substrate, wherein the interconnection layer comprises a plurality of dielectric layers and a plurality of conductive layers alternately stacked up along a build-up direction;
   forming a first transistor in between the plurality of dielectric layers, wherein forming the first transistor comprises:
      forming a gate electrode, a gas impermeable layer, a ferroelectric layer and a channel layer sequentially stacked up along the build-up direction, wherein the gas impermeable layer physically separates the gate electrode from the ferroelectric layer, and wherein at least one of the plurality of dielectric layers is surrounding the ferroelectric layer and the channel layer.

9. The method according to claim 8, further comprises forming a second transistor in between the plurality of dielectric layers, wherein forming the second transistor comprises:
   forming a second gate electrode, the gas impermeable layer, a second ferroelectric layer and a second channel layer sequentially stacked up along the build-up direction, wherein the gas impermeable layer extends from a position above the gate electrode of the first transistor to a position above the second gate electrode of the second transistor.

10. The method according to claim 8, wherein the gas impermeable layer comprises, aluminum oxide, titanium oxide, or a combination thereof.

11. The method according to claim 8, further comprises forming a second gas impermeable layer sandwiched in between the ferroelectric layer and the channel layer, and physically separating the ferroelectric layer from the channel layer.

12. The method according to claim 11, further comprises forming an intermediate gas impermeable layer located in the ferroelectric layer and in between the gas impermeable layer and the second gas impermeable layer, wherein the intermediate gas impermeable layer separates the ferroelectric layer into a first sub-layer and a second sub-layer.

13. The method according to claim 11, further comprises forming a capping layer disposed on sidewalls of the channel layer and the ferroelectric layer, and joining the gas impermeable layer to the second gas impermeable layer.

14. The method according to claim 8, wherein forming the gas impermeable layer includes forming a first portion in between the gate electrode and the ferroelectric layer, and forming a second portion in between a gate dielectric layer and the ferroelectric layer, wherein the second portion surrounds the first portion, and a thickness of the first portion is greater than a thickness of the second portion.

15. A method, comprising:
    forming a gate electrode on a substrate;
    forming a channel layer over the gate electrode;
    forming a gas impermeable layer physically separating the channel layer from the gate electrode, wherein sidewalls of the gas impermeable layer are offset with sidewalls of the gate electrode and offset with sidewalls of the channel layer;
    forming a ferroelectric layer in between the gate electrode and the channel layer; and
    forming a dielectric layer laterally surrounding the ferroelectric layer and the channel layer.

16. The method according to claim 15, further comprises:
    forming a bit line and a source line embedded in the dielectric layer; and
    forming a bit line contact and a source line contact electrically connected to the bit line and the source line.

17. The method according to claim 15, further comprises forming a second gas impermeable layer in between the ferroelectric layer and the channel layer, wherein the second gas impermeable layer and the gas impermeable layer are located on two opposing surfaces of the ferroelectric layer.

18. The method according to claim 17, further comprises forming an intermediate gas impermeable layer located in the ferroelectric layer and in between the gas impermeable layer and the second gas impermeable layer, wherein the intermediate gas impermeable layer separates the ferroelectric layer into a first sub-layer and a second sub-layer.

19. The method according to claim 15, further comprises:
    forming a second gate electrode on the substrate aside the gate electrode; and
    forming a second channel layer over the second gate electrode, and wherein the gas impermeable layer is formed to physically separate the second channel layer from the second gate electrode.

20. The method according to claim 15, wherein the gas impermeable layer is formed by atomic layer deposition (ALD) or chemical vapor deposition (CVD), and includes a gas impermeable material selected from aluminum oxide or titanium oxide.

* * * * *